(12) United States Patent
Confalonieri

(10) Patent No.: US 6,822,906 B2
(45) Date of Patent: Nov. 23, 2004

(54) SENSE AMPLIFIER STRUCTURE FOR MULTILEVEL NON-VOLATILE MEMORY DEVICES AND CORRESPONDING READING METHOD

(75) Inventor: Emanuele Confalonieri, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/331,158

(22) Filed: Dec. 26, 2002

(65) Prior Publication Data

US 2003/0156458 A1 Aug. 21, 2003

(30) Foreign Application Priority Data

Dec. 28, 2001 (EP) .............................. 01830828
Aug. 5, 2002 (EP) .............................. 02019284

(51) Int. Cl.[7] .............................................. G11C 16/00
(52) U.S. Cl. .................... 365/185.21; 365/207; 327/52; 327/53
(58) Field of Search .................. 365/185.21, 185.2, 365/207, 189.07; 327/52, 53

(56) References Cited

U.S. PATENT DOCUMENTS

| | | | |
|---|---|---|---|
| 4,523,110 A | 6/1985 | Johnson | 307/530 |
| 5,022,003 A | 6/1991 | Kohno | 365/189.01 |
| 5,255,233 A | 10/1993 | Izumi | 365/207 |
| 5,923,590 A | 7/1999 | Yero | 365/189.01 |
| 6,256,247 B1 * | 7/2001 | Perner | 365/209 |
| 6,317,362 B1 * | 11/2001 | Nomura et al. | 365/185.2 |
| 6,400,606 B1 * | 6/2002 | Cho | 365/185.2 |
| 6,407,946 B2 * | 6/2002 | Maruyama et al. | 365/185.2 |
| 6,504,761 B2 * | 1/2003 | Kai et al. | 365/185.21 |
| 2002/0101775 A1 | 8/2002 | Nojiri et al. | 365/207 |

* cited by examiner

*Primary Examiner*—Tan T. Nguyen
(74) *Attorney, Agent, or Firm*—Lisa K. Jorgenson; Robert Iannucci; Seed IP Law Group PLLC

(57) ABSTRACT

A sense amplifier structure for multi-level non-volatile memories reads the contents of the memory cells. In particular, a current drawn by a memory cell to be read is compared to a current drawn by a reference cell through a sense amplifier that has one input terminal connected to a circuit node to which said currents are led. Advantageously, the currents are compared at both inputs of the sense amplifier by connecting a second input of said amplifier to a circuit node to which said currents are led, with opposite signs. The method enhances the read precision of the sense amplifier for a given data acquisition time by doubling the differential input voltage.

11 Claims, 3 Drawing Sheets

SENSE AMPLIFIER STRUCTURE FOR MULTILEVEL NON-VOLATILE MEMORY DEVICES AND CORRESPONDING READING METHOD

BACKGROUND OF THE INVENTION

1. Field of the Invention

The present invention broadly relates to an electronic multi-level non-volatile memory device, which is monolithically integrated in a semiconductor and includes a circuit structure for reading data from the memory.

The invention relates to a sense amplifier structure for reading non-volatile memories, in particular multi-level flash EEPROMs.

Specifically, the invention relates to a sense amplifier for multi-level non-volatile memories arranged as cell arrays or matrix, said sense amplifier including at least one differential stage having an input terminal connected to a circuit node receiving a current drawn by a memory cell to be read and a current drawn by a reference cell for comparison.

The invention further relates to a method of accurately reading data from multi-level non-volatile memories, wherein a current drawn by a memory cell to be read and a current drawn by a reference cell are compared to each other by means of a sense amplifier having an input terminal connected to a circuit node to which both currents are led.

2. Description of the Related Art

As is known in this technical field, the most recent developments in the field of non-volatile memories, in particular of the EPROM, EEPROM and flash types, trend toward providing increased storage capacity through the use of multi-level architectures, i.e., memory matrix whose cells can store plural logic states.

However, the aspects of this invention can be more clearly understood if the circuit constructions of classic two-level memories are first reviewed briefly.

Electronic memory devices usually comprise at least one array of memory cells arranged into rows and columns in the array; logic information can be written into, or read from, each cell by suitably biasing its corresponding row and column.

A typical memory cell comprises a field-effect transistor having a control gate terminal, a floating gate region coupled capacitively to the control gate, a source terminal, and a drain terminal. The two attainable logic states of a two-level memory cell, e.g., a logic "0" to denote a programmed cell and a logic "1" to denote an erased cell, are separated by a range of potential.

The informational contents of a two-level non-volatile memory cell is discriminated by comparison with a reference cell, the latter being an identical structure with the former, except that its state is intermediate with respect to the two allowed logic states for the matrix cells.

The operation of selecting a memory cell to read its informational contents consists of applying a suitable bias voltage to the control gate terminal of the cell. If the cell has been programmed, an electric charge is caught in the floating gate region, and the threshold voltage of the cell is such that the cell will conduct a lower drain current than the reference cell.

By converse, if the cell has been erased, no electric charge is caught in the floating gate region, and the cell will conduct a larger drain-source current than the reference cell.

Thus, the most widely used method of reading a flash memory cell comprises comparing the current drawn by the cell to be read with the current drawn by the reference cell. A simple comparator, known as the sense amplifier, makes the comparison and correspondingly outputs a result. The sense amplifier is to compare the cell current draw with the current drawn by the reference cell, thereby converting the analog information of the addressed data to a digital form.

In multi-level memories, n bits per cell are stored, it being n>1. This greatly enhances the array efficiency as concerns its storage capacity per unit area. Accordingly, in the instance of a multi-level memory device, at least $2^n-1$ references are needed in order to discriminate a cell having a storage capacity of n bits, which references may be either voltage or current references according to the reading method being used.

Exemplary of the state of the art is a technique for determining the state of an n-level memory cell disclosed in U.S. Pat. No. 5,774,395, which is incorporated by reference in its entirety.

A key factor in the design of multi-level memories is its read circuitry, and there are essentially two modes that can be used: the serial or the parallel mode.

To store n bits into a multi-level cell, the cell must have $2^n$ attainable states: for instance, 4 states must be allowed when 2 bits are to be stored.

Two cells having different states differ from each other by the charge that is stored in their floating gate, and hence by their threshold. Typically, to determine the state of a multi-level cell, the cell has to be compared with $2^n-1$ reference cells. The comparison may be performed in the serial or the parallel mode, as mentioned above.

The parallel mode is preferred whenever read time is required to be very short. For instance, when two bits per cell are to be stored, three sense amplifiers must be provided for each bit pair of the byte being read. The three sense amplifiers will compare the currents of three reference cells R1, R2, R3 with the current of the selected cell in the array.

FIG. 1a shows a basic circuit diagram for a sense amplifier circuit structure 1 that is intended for a single-level memory. It can be seen that the comparison between the current drawn by an array cell and that drawn by a reference cell is performed at an input terminal I1 of a differential stage 2. The other input terminal I2 is biased to a constant voltage. The current difference generates a differential voltage at the input of the differential stage 2. The output of the differential stage 2 is connected to an inverter 3, and is initially precharged to a voltage level that will set the inverter 3 for maximum gain.

FIG. 1b shows in greater detail the construction of the differential stage of FIG. 1a, and FIG. 1c shows schematically the types of signal that appear in the differential stage and the inverter placed after it.

During the precharging step, a signal deprech will be at a high logic level and its negation, deprech-n, at a low logic level. When the signals deprech and deprech-n are switched, the output from the differential stage 2, represented by a node outdiff, is left to itself and allowed to float. This output will vary its voltage with the output current of the differential stage 2, and the variation will be amplified by the inverter 3. The output from the inverter 3 is stored into a latching register 4 that is controlled by signals salatch and salatch-n. For the reading to be successful, the variation at the input of the inverter 3 must be larger than its transition range.

One comparison term between different sense amplifier designs, and one that is vital to multi-level memories, is precision. The precision of a sense amplifier grows inversely with the current gap between the cell to be read and the reference cell; a minimum gap will ensure successful reading.

This precision should be correlated with the sense amplifier timing, because precision increases with acquisition time.

Thus, a comparison of different sense amplifier architectures should be performed under the same conditions of memory data acquisition time.

While being advantageous on several counts, the above prior art still leaves something to be desired from the standpoint of data acquisition accuracy.

BRIEF SUMMARY OF THE INVENTION

An embodiment of this invention provides both a method of reading data from a multi-level non-volatile memory and an associated sense amplifier structure with appropriate design and functional features to ensure accurate reading and overcome the limitations that beset the performance of prior sense amplifiers.

The method performs a comparison of currents at both input terminals of the differential stage of the sense amplifier.

The features and advantages of the sense amplifier structure and data reading method of this invention will be more clearly apparent from the following description of embodiments thereof, given by way of example and not of limitation with reference to the accompanying drawings.

DETAILED DESCRIPTION OF THE INVENTION

Figure 1A:
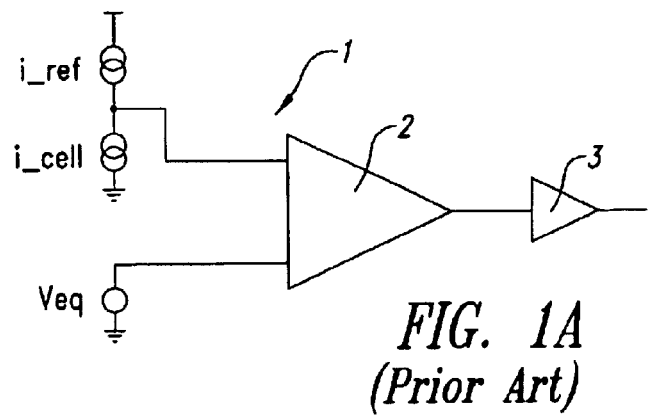
FIG. 1a shows schematically a sense amplifier structure according to the prior art.
Figure 1B:
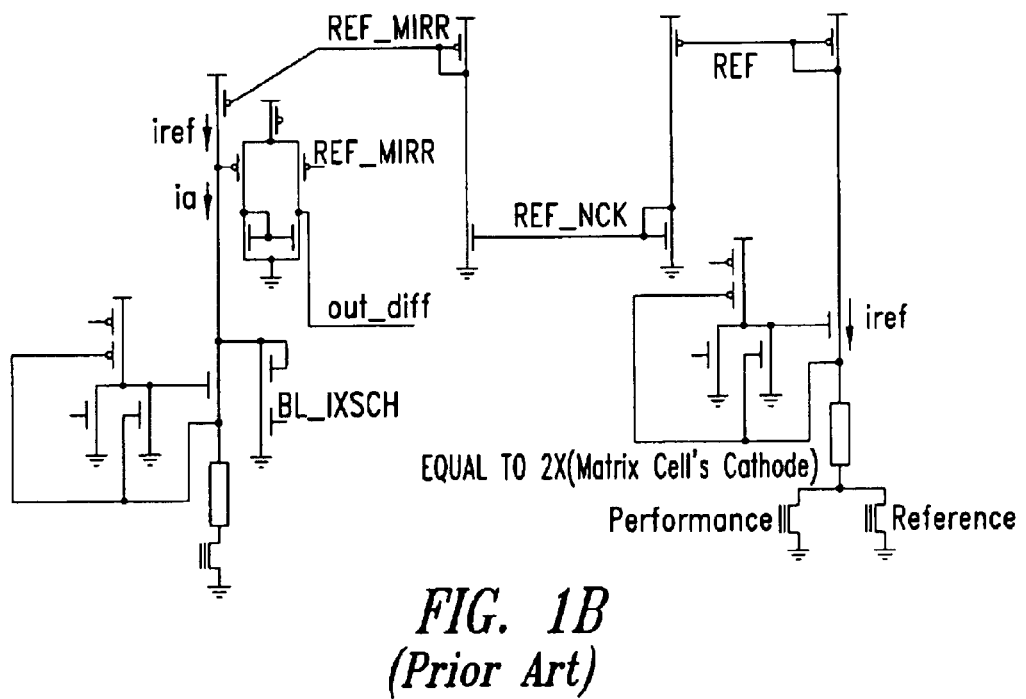
FIG. 1b shows the circuit structure of FIG. 1a in further detail.
Figure 1C:
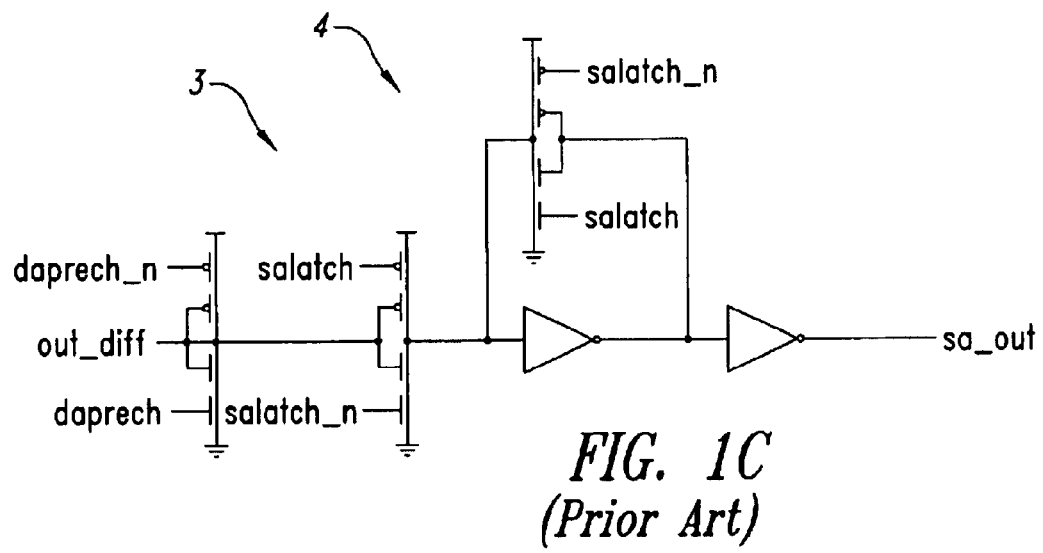
FIG. 1c shows schematically the types of signal that appear in the sense amplifier of FIG. 1a and in an inverter connected after it.

With reference to the drawing views, generally shown at 5 in schematic form is a sense amplifier structure according to the invention for use with a non-volatile memory device that incorporates a multi-level memory cell matrix. The array of memory cells is omitted from the drawings because conventional; only one cell is shown schematically at 6 to represent a memory cell on which a data reading operation can be performed.

The memory device is of a type that is integrated monolithically in a semiconductor and adapted to be programmed and erased electrically, e.g., an EEPROM or a flash EEPROM. Also, the memory device may be a single or a double power supply type.

The considerations that follow apply equally to any other types of EEPROM or flash EEPROM, as well as to EPROMs. Furthermore, the construction and operation of cooperating component parts and elements in the inventive circuit that are similar to those in the conventional circuit of FIG. 1a will be denoted by the same reference numerals.

The memory array is set up conventionally as rows or wordlines, and columns or bitlines. Each cell comprises a floating gate transistor having a drain region and a source region, which regions are formed on a semiconductor substrate and separated by a channel region. The floating gate is formed above the substrate and separated from the latter by a thin layer of gate oxide. A control gate is coupled capacitively to the floating gate through a dielectric layer. The control gate is the control terminal of the transistor, with the drain and source terminals forming its conduction terminals.

The array of memory cells is preferably divided into a plurality of sectors that are programmable electrically, even by the byte.

As is known, all the memory cells in one wordline share the electric line that drives the respective control gates, and all the memory cells in one bitline have their drain terminals in common. The source terminals of the memory cells are all connected to the same reference of potential, e.g., to ground.

By applying appropriate voltage values to the terminals of a memory cell, the amount of charge in its floating gate can be changed, thus changing the cell state. The operation of storing charge into the floating gate is known as "programming" and consists of biasing the control gate and the drain terminal to a predetermined voltage value that is higher than the potential at the source terminal.

A flash memory may be programmed in the word mode or the page mode. In the former, the information units are programmed one at a time; in the latter, a multiple of the information unit is programmed according to the characteristics of the memory. The cells in one word locate physically in the same array row and are addressed simultaneously.

As to the reading step, all that is required is to compare the current drawn by a memory cell 6 to the current drawn by a reference cell 7, the latter being usually an identical cell with an array cell which and factory programmed to normally take a predetermined state intermediate the erased and programmed states of the array cell.

The comparison is usually performed by connecting one input terminal I1 of a differential stage 2 to a circuit node, to which node a current $i_{13}$ cell flowing through a suitably biased memory cell 6 and a current i_ref flowing through a similarly biased reference cell 7 are led. The other input terminal I2 of the stage 2 is biased to a constant voltage.

The difference between the currents i_cell and i_ref will generate a differential voltage at the input of the differential stage 2. The output OUTDIFF from the differential stage 2 is taken to an inverter 3.

Figure 2A:
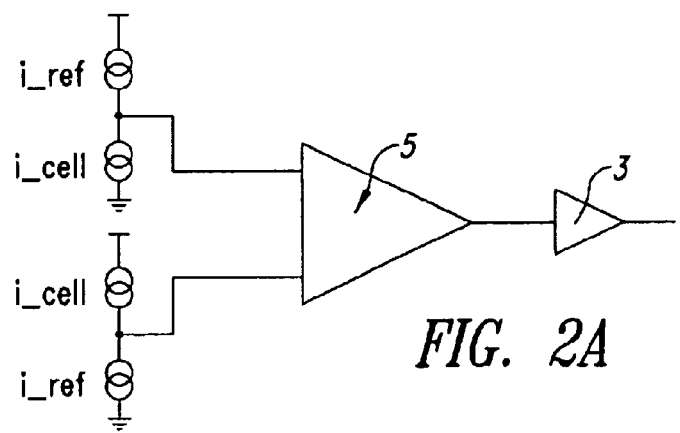
FIG. 2a shows schematically a sense amplifier structure according to the invention.
Figure 2B:
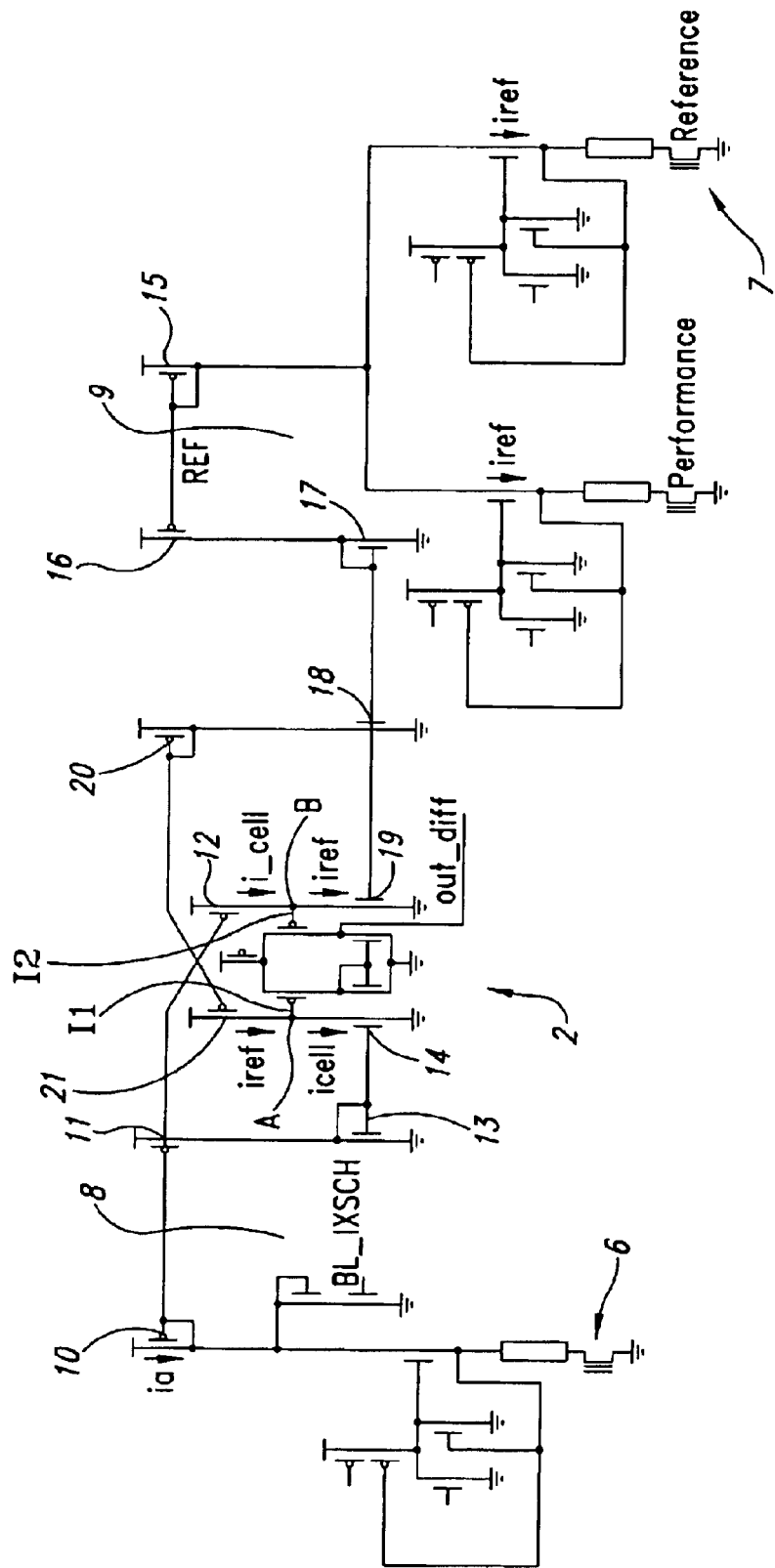
FIG. 2b shows the circuit structure of FIG. 2a in further detail.

Advantageously in the embodiment shown in FIGS. 2a, 2b, the effectiveness of the step of reading the contents of the multi-level cells is enhanced by a particular sense amplifier structure being provided that yields twice as accurate a reading as in the prior art.

The read precision thus obtained will be denoted π in the following relations:

$$\Delta i = \text{i\_cell} - \text{i\_ref}$$

$$Vd(t) = \Delta i * t * (1/Cindiff)$$

where Cindiff is the capacitance of the input node I1;

$$i\text{-outdiff}(t) = 2*gm(Vd)*Vd(t)$$

where i–outdiff(t) is the variation against time of the current outflowing from the differential stage, and gm is the transconductance of the differential input transistor;

$$\Delta V\_outdiff = \int_0^{\Delta T} i\_outdiff(t) \cdot 1/(Coutdiff)\, dt$$

where Coutdiff is the capacitance of the differential output node.

In order for the reading to be successful, the variation $\Delta V\_outdiff$ of the differential output voltage should be adequate to change over the amplifier downstream, so that it is:

$$\Delta V\_outdiff = \tfrac{1}{2} * \Delta Vtransition\_region$$

The precision $\pi$ is taken as the inverse of the gap of the input currents $\Delta i'$ at which $\Delta V\_outdiff$ satisfies the above condition, now written as:

$$\int_0^{\Delta T} gm(Vd) \cdot \Delta i' \cdot 1/(Coutdiff * Coutdiff)\, dt = 1/2 * \Delta Vtransition\_region$$

$$\pi = 1/\Delta i'$$

FIG. 2a shows the novel sense amplifier structure 5. The gist of it is that the comparison of currents Ic and Irif takes place at both input terminals of the differential stage 2 with opposite signs.

In this way, a double differential signal, and hence a dual variation of the differential output voltage, will be generated for a given time length.

In other words, a double precision $\pi$ is achieved because the variation in the output voltage of the differential stage 2 will shift the inverter 3 out of its transition range, with a difference between the currents i_cell and i_ref that is one half that of the prior art.

Consider, for instance:

$$Vd(t) = 2\Delta i * t * (1/Cindiff)$$

$$i\_outdiff(t)\_new(t) = 2i - Outdiff(t)$$

whence:
$\Delta V\_outdiff\_new = 2\Delta V\_outdiff$ and $$\pi\_new = 2\pi\_old$$

FIG. 2b shows in greater detail the construction of the sense amplifier 5. The simple and symmetrical complexion of the circuit construction can be appreciated, in which the currents Ic and Irif are led to the input terminals I1 and I2 of the differential stage 2 in opposite directions.

These currents are applied to the terminals I1, I2 through current mirrors 8, 9 associated with the cell 6 to be read and the reference cell 7, respectively. The first current mirror 8 includes a diode-connected first transistor 10 having its gate and drain connected to the cell 6. The gate and drain of the first transistor 10 are also connected to the gates of second and third transistors 11, 12. The drain of the second transistor 11 is connected to the drain and gate of a diode-connected fourth transistor 13, which are also connected to the gate of a fifth transistor 14. The drain of the fifth transistor 14 is connected to a node A connected to the first input terminal I1 of the differential stage 2 such that the cell current i_cell is provided through the fifth transistor 14 to the node A. The drain of the third transistor 12 is connected to a node B connected to the second input terminal I2 of the differential stage 2 such that the cell current i_cell is provided through the third transistor 12 to the node B.

The first current mirror 9 includes a diode-connected second transistor 15 having its gate and drain connected to the reference cell 7. The gate and drain of the first transistor 15 are also connected to the gate of a second transistor 16 having its drain connected to the drain and gate of a diode-connected third transistor 17. The drain and gate of the third transistor 17 are also connected to the gates of fourth and fifth transistors 18, 19. The drain of the fourth transistor 18 is connected to the drain and gate of a diode-connected sixth transistor 20, which are also connected to the gate of a seventh transistor 21. The drain of the seventh transistor 21 is connected to the node A and the first input terminal I1 of the differential stage 2 such that the reference cell current i_ref is provided through the seventh transistor 12 to the node A. The drain of the fifth transistor 19 is connected to the node B and to the second input terminal I2 of the differential stage 2 such that the reference cell current i_ref is provided through the fifth transistor 19 to the node B. As shown, the cell and reference cell currents i_cell, i_ref at the node B are of opposite sign compared to the cell and reference cell currents i_cell, i_ref at the node A.

It will be appreciated that the current mirrors 8, 9 shown in FIG. 2b are exemplary only. Those skilled in the art will recognize that numerous other current mirrors could be employed to provide the cell and reference cell currents to both of the nodes A,B.

To summarize, in the structure 5 of FIG. 2b, the differential stage 2 has the input terminal I1 connected to a circuit node A into which both the current i_cell drawn by the memory cell 6 to be read and the current i_ref drawn by the reference cell 7 are conveyed. Advantageously, moreover, the second input I2 of the differential stage 2 is connected to a circuit node B into which both currents i_cell and i_ref are conveyed, but with opposite signs from the first input.

Thus, the current comparison will be performed at both inputs of the differential stage 1 of the sense amplifier.

The structure of this invention enhances the read precision of the sense amplifier for a given data acquisition time by providing a differential input voltage that is twice higher.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A sense amplifier structure for multi-level non-volatile memories arranged as cell arrays, said sense amplifier comprising a differential stage having a first input terminal connected to a circuit node receiving a current drawn by a memory cell to be read and a current drawn by a reference cell for comparison, and a second input terminal connected to a circuit node to which said currents are led in such a manner that the comparison will take place at both inputs of the amplifier; wherein said currents that are led to the node connected to said second input terminal have opposite directions from the currents that are led to the node connected to the first input terminal.

2. A sense amplifier structure according to claim 1, further comprising current mirrors connected between each input terminal of the differential stage and said memory cell to be read and reference cell, respectively.

3. A sense amplifier structure according to claim 1, further comprising an inverter connected to an output of said differential stage.

4. A method of accurately reading data from multi-level non-volatile memories, the method comprising comparing a current drawn by a memory cell to be read with a current drawn by a reference cell through a sense amplifier, said sense amplifier having a first input terminal connected to a circuit node to which said currents are led, and a second input terminal, wherein said currents are compared at both inputs of the amplifier by connecting the second input terminal of said amplifier to a circuit node to which said currents are led; said currents being led to the node connected to said second input terminal having opposite directions from the currents that are led to the node connected to the first input terminal.

5. A method according to claim 4, wherein said currents are mirrored on the nodes connected to the first and the second input terminal.

6. A sense amplifier for multi-level non-volatile memories, the sense amplifier comprising:

a differential stage having first and second input terminals, and an output terminal;

first means for comparing a cell current drawn by a memory cell to be read to a reference current drawn by a reference cell, and providing a result of the comparison to the first input terminal of the differential stage; and second means for comparing the cell current to the reference current, and providing a result of the comparison by the second means to the second input terminal of the differential stage.

7. The sense amplifier of claim 6, wherein the first means includes a first current mirror having a first output connected to the first input terminal and a second output connected to the second input terminal and the second means includes a second current mirror having a first output connected to the first input terminal and a second output connected to the second input terminal.

8. The sense amplifier of claim 7 wherein the first current mirror includes a first output transistor connected between a first voltage reference and the first input terminal and a second output transistor connected between a second voltage reference and the second input terminal and the second current mirror includes a third output transistor connected between the first voltage reference and the second input terminal and a fourth output transistor connected between the second voltage reference and the first input terminal.

9. The sense amplifier of claim 6 wherein the result provided by the first means is a first voltage and the result provided by the second means is a second voltage.

10. The sense amplifier of claim 6 wherein the first means includes a first output transistor connected between a first voltage reference and the first input terminal and a second output transistor connected between a second voltage reference and the second input terminal and the second means includes a third output transistor connected between the first voltage reference and the second input terminal and a fourth output transistor connected between the second voltage reference and the first input terminal.

11. The sense amplifier of claim 6, further comprising an inverter connected to the output of the differential stage.

* * * * *